(12) United States Patent
Yi et al.

(10) Patent No.: US 11,647,657 B2
(45) Date of Patent: May 9, 2023

(54) DISPLAY PANEL AND DISPLAY DEVICE

(71) Applicant: Wuhan China Star Optoelectronics Semiconductor Display Technology Co., Ltd., Hubei (CN)

(72) Inventors: Chujun Yi, Hubei (CN); Tao Chen, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 260 days.

(21) Appl. No.: 17/275,200

(22) PCT Filed: Dec. 18, 2020

(86) PCT No.: PCT/CN2020/137613
§ 371 (c)(1),
(2) Date: Mar. 11, 2021

(87) PCT Pub. No.: WO2022/095236
PCT Pub. Date: May 12, 2022

(65) Prior Publication Data
US 2022/0310743 A1 Sep. 29, 2022

(30) Foreign Application Priority Data
Nov. 5, 2020 (CN) .......................... 202011225069.6

(51) Int. Cl.
*G09G 3/3233* (2016.01)
*H01L 27/32* (2006.01)

(52) U.S. Cl.
CPC ....... *H01L 27/3276* (2013.01); *G09G 3/3233* (2013.01); *H01L 27/3213* (2013.01); *H01L 27/3246* (2013.01); *G09G 2320/0233* (2013.01)

(58) Field of Classification Search
CPC ............. H01L 27/3234; H01L 27/3276; H01L 27/3246; H01L 27/3213; G09G 3/3233; G09G 2320/0233
See application file for complete search history.

(56) References Cited

U.S. PATENT DOCUMENTS

| 10,884,305 | B2* | 1/2021 | Yoshida | ............... G02F 1/13338 |
| 11,442,587 | B2* | 9/2022 | Song | ..................... G06F 3/0446 |
| 2017/0154566 | A1* | 6/2017 | Ryoo | ................... G09G 3/3648 |
| 2017/0162637 | A1* | 6/2017 | Choi | ................... H01L 27/3276 |

* cited by examiner

*Primary Examiner* — Kevin M Nguyen

(57) ABSTRACT

A display panel and a display device are provided. The display panel includes: a plurality of sub-pixels including at least two first sub-pixels positioned in a display light-transmitting area, and a connecting line including a first line electrically connected to a first pixel driving circuit and the at least two first sub-pixels, wherein at least part of the first line is snake-shaped, so as to reduce the problem of light interference and diffraction in the display light-transmitting area and improve the display effect of the display light-transmitting area.

20 Claims, 9 Drawing Sheets

DISPLAY PANEL AND DISPLAY DEVICE

RELATED APPLICATIONS

This application is a National Phase of PCT Patent Application No. PCT/CN2020/137613 having International filing date of Dec. 18, 2020, which claims the benefit of priority of Chinese Patent Application No. 202011225069.6 filed on Nov. 5, 2020. The contents of the above applications are all incorporated by reference as if fully set forth herein in their entirety.

FIELD AND BACKGROUND OF THE INVENTION

This application relates to the field of display technology, and in particular to a display panel and a display device.

Camera under panel (CUP) technology used in display panels ensures that display panels have better light transmittance while realizing a full-screen display design. However, because space of the CUP area is small, a pixel driving circuit of the CUP area can be arranged on a periphery of the CUP area. In addition, in order to realize electrical connection between the pixels in the CUP area and the driving circuit positioned on the periphery of the CUP area, multiple straight leads need to be arranged in the limited space of the CUP area, which would cause light interference and diffraction in the CUP area, affecting imaging effect of the camera and display effect of the display panel.

Embodiments of the present application provide a display panel and a display device, which can reduce light interference and diffraction problems in the display light-transmitting area and improve light transmittance and display effects of the display light-transmitting area.

SUMMARY OF THE INVENTION

An embodiment of the present application provides a display panel. The display panel includes a display light-transmitting area, a main display area, and a transition display area between the main display area and the display light-transmitting area. The display panel includes: a plurality of sub-pixels including at least two first sub-pixels positioned in the display light-transmitting area; a first pixel driving circuit positioned in the transition display area and configured to drive the at least two first sub-pixels to emit light; and a connecting line including a first line electrically connected to the first pixel driving circuit and the at least two first sub-pixels, wherein at least part of the first line is snake-shaped.

In some embodiments, the first line includes at least a first connecting line positioned in the display light-transmitting area and electrically connected to the at least two first sub-pixels. The first connecting line is snake-shaped.

In some embodiments, the first line further includes a second connecting line electrically connected to the first pixel driving circuit, the second connecting line extends in a direction from the transition display area toward the display light-transmitting area and is connected to the first connecting line, and at least part of the second connecting line positioned in the display light-transmitting area is snake-shaped.

In some embodiments, a shape of the first connecting line is different from a shape of the second connecting line, and/or an extension direction of the first connecting line is different from an extension direction of the second connecting line, and/or an extension width of the first connecting line is different from an extension width of the second connecting line.

In some embodiments, the second connecting line includes a first extension portion, a second extension portion, and a third extension portion. One end of the first extension portion is connected to the first connecting line, the second extension portion is connected to the first extension portion and the third extension portion. An extension direction of the first extension portion is different from an extension direction of the second extension portion. The first extension portion and the third extension portion are positioned on different extension lines.

In some embodiments, at least part of the second extension portion is a polyline, and an angle between segments of the polyline is an obtuse angle.

In some embodiments, the first line further includes a third connecting line positioned in the display light-transmitting area, and the third connecting line is electrically connected to the first connecting line and at least one of the first sub-pixels, and wherein a shape of the first connecting line is different from a shape of the third connecting line.

In some embodiments, the plurality of sub-pixels further includes second sub-pixels positioned in the display light-transmitting area, the first connecting line includes a first connecting portion and a second connecting portion connected to the first connecting portion, the first connecting portion is electrically connected to one of the first sub-pixels, and the second connecting portion bypasses the second sub-pixels.

In some embodiments, the display panel further includes a second pixel driving circuit positioned in the transition display area configured to drive at least two of the second sub-pixels to emit light. The connecting line further includes a second line electrically connected to the second pixel driving circuit and the at least two second sub-pixels, and at least part of the second line is snake-shaped.

In some embodiments, the plurality of sub-pixels further include third sub-pixels positioned in the display light-transmitting area, the second line includes at least a fourth connecting line positioned in the display light-transmitting area and electrically connected to the at least two second sub-pixels, the fourth connecting line is snake-shaped, the fourth connecting line includes a third connecting portion and a fourth connecting portion connected to the third connecting portion, the third connecting portion is electrically connected to one of the second sub-pixels, and the fourth connecting portion bypasses the third sub-pixels.

In some embodiments, the connecting line further includes a third line electrically connected to a third pixel driving circuit and at least two of the third sub-pixels, and at least part of the third line is snake-shaped.

In some embodiments, the third line includes at least a fifth connecting line positioned in the display light-transmitting area and electrically connected to the at least two third sub-pixels, wherein the fifth connecting line is snake-shaped. The fifth connecting line includes a fifth connecting portion and a sixth connecting portion connected to the fifth connecting portion, the fifth connecting portion is electrically connected to one of the third sub-pixels, and the sixth connecting portion bypasses the first sub-pixels.

In some embodiments, a curvature of the first connecting portion is different from a curvature of the second connecting portion, and/or a curvature of the third connecting portion is different from a curvature of the fourth connecting portion, and/or a curvature of the fifth connecting portion is different from a curvature of the sixth connecting portion.

In some embodiments, a minimum distance between the first connecting line and the fourth connecting line, and/or a minimum distance between the first connecting line and the fifth connecting line, and/or a minimum distance between the fourth connecting line and the fifth connecting line is/are greater than 2 microns.

In some embodiments, the extension directions of the first connecting line, the fourth connecting line, and the fifth connecting line are different.

In some embodiments, a center of a curvature circle of the first connecting portion and a center of a curvature circle of the second connecting portion are respectively positioned on opposite sides of the first connecting line.

In some embodiments, a minimum distance between the second connecting portion and the second sub-pixels is greater than 2 microns.

In some embodiments, the display panel further includes: a first wiring arranged in the transition display area, positioned on a side of the second connecting line away from the first connecting line, and electrically connected to the first pixel driving circuit; and a second insulating layer positioned between the first wiring and the second connecting line. The first wiring and the second connecting line are electrically connected together through a via-hole in the second insulating layer.

In some embodiments, the display panel further includes: a first electrode layers disposed in a same layer as the first connecting line, wherein the first connecting line connects two of the first electrode layers; and a first electrode portion positioned on the first electrode layers and electrically connected to the first electrode layers. The first electrode portion and the first electrode layer form an anode of the at least two first sub-pixels.

An embodiment of the present application further provides a display device including the above-mentioned display panel and a sensor, and the sensor is disposed corresponding to the display light-transmitting area.

Compared with the prior art, embodiments of the present application provide a display panel and a display device. The display panel includes a display light-transmitting area, a main display area, and a transition display area between the main display area and the display light-transmitting area. The display panel includes: a plurality of sub-pixels including at least two first sub-pixels positioned in the display light-transmitting area; a first pixel driving circuit positioned in the transition display area, and configured to drive the at least two first sub-pixels to emit light; a connecting line including a first line electrically connected to the first pixel driving circuit and the at least two first sub-pixels, wherein at least part of the first line is snake-shaped. It avoids the problems of light interference and diffraction in the display light-transmitting area, and improves the display effect of the display light-transmitting area.

DESCRIPTION OF SPECIFIC EMBODIMENTS OF THE INVENTION

In order to make the purpose, technical solutions, and effects of this application clear, the following further describes this application in detail with reference to the drawings and embodiments. It should be understood that the specific embodiments described here are only used to explain the application, and not used to limit the application.

Figure 1A:
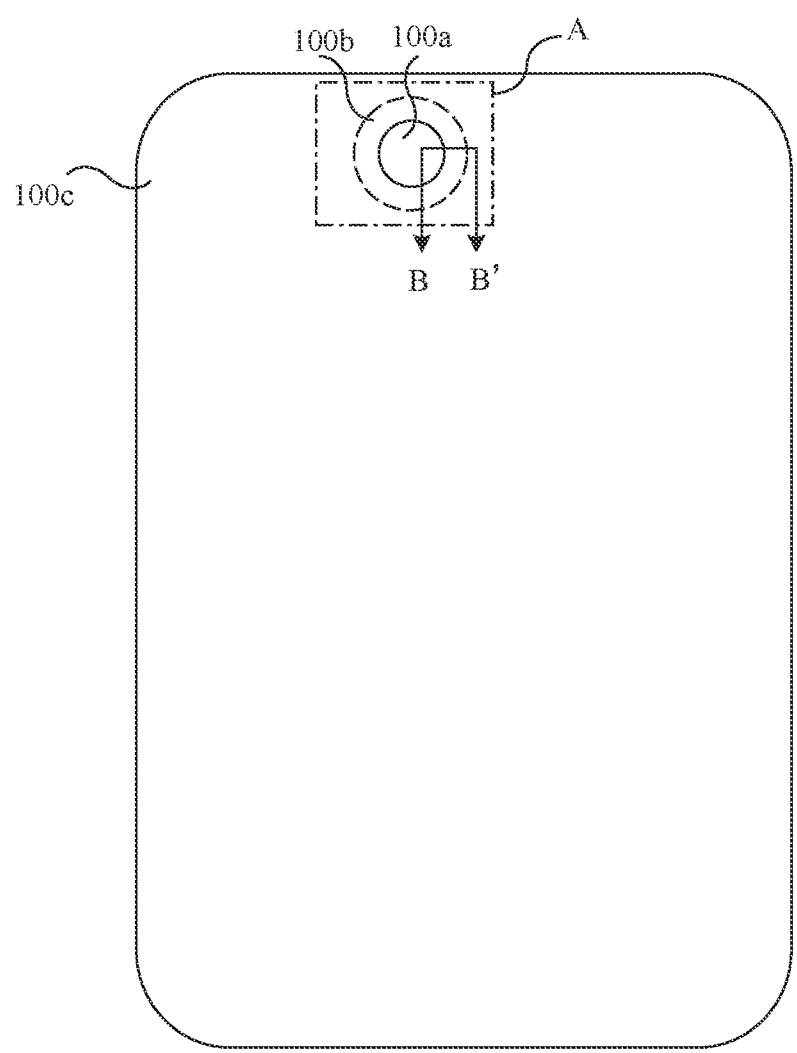
FIG. 1A is a schematic structural diagram of a display panel provided by an embodiment of the application.
Figure 1B:
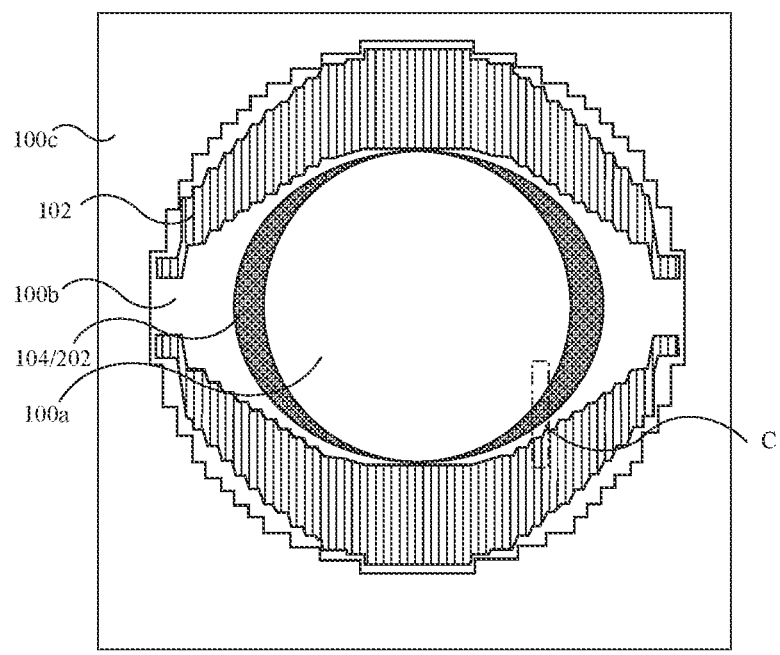
FIG. 1B is a partially enlarged view of A in FIG. 1A.
Figure 1C:
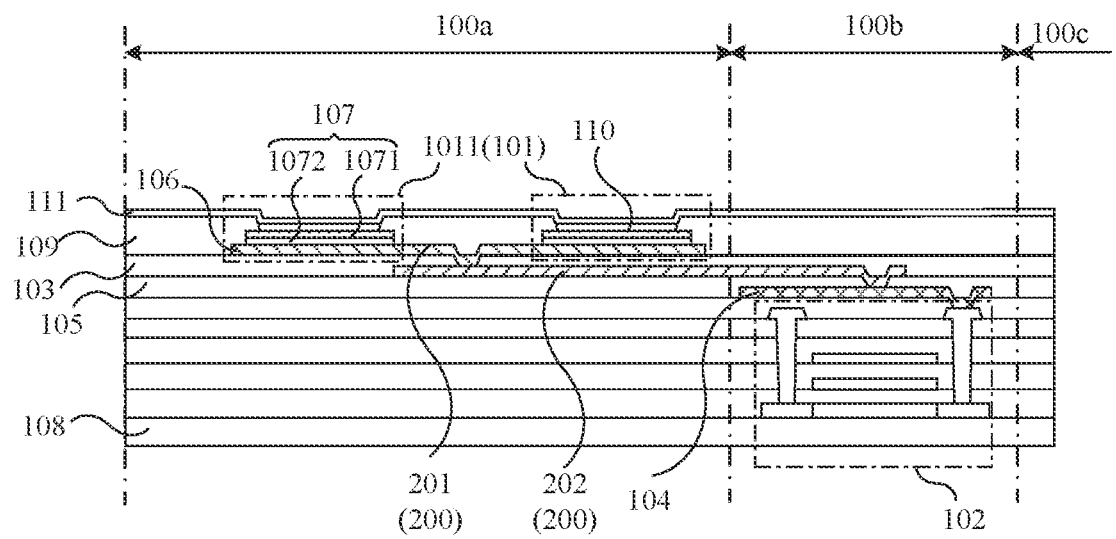
FIG. 1C is a schematic structural diagram of the display panel in FIG. 1A taken along a B-B' section.
Figure 1D:
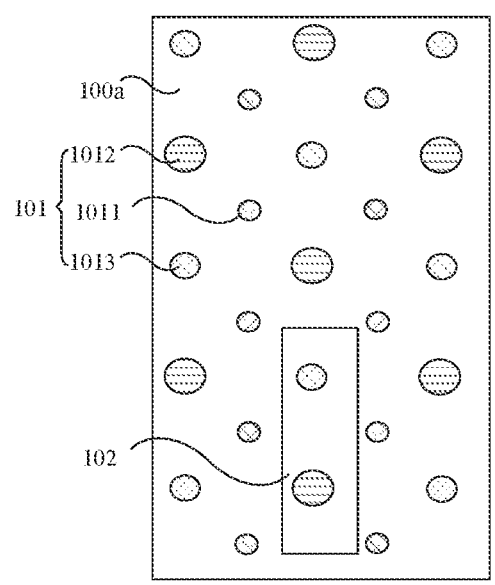
FIG. 1D is a partially enlarged view of C in FIG. 1B.
Figure 2A:
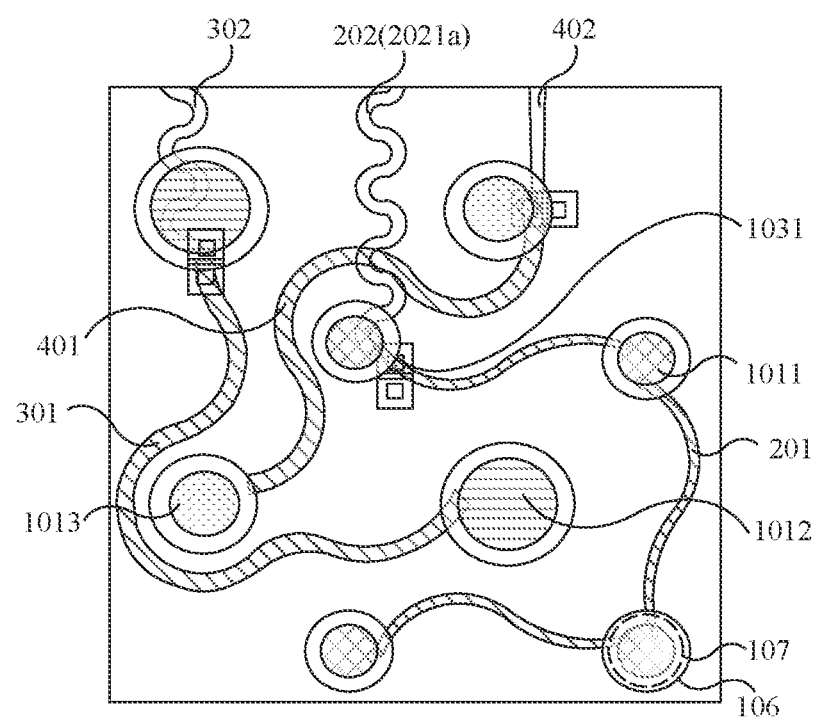
FIGS. 2A, 2B, 2C, 2D, 2E and 2F are structural schematic diagrams of connecting lines provided by embodiments of the application.
Figure 2B:
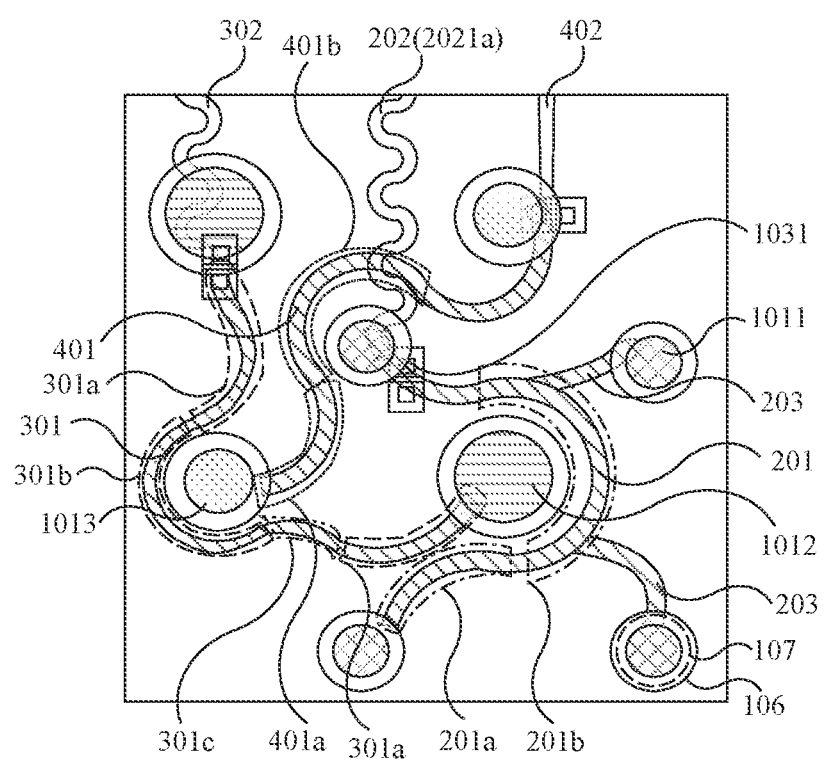
Figure 2C:
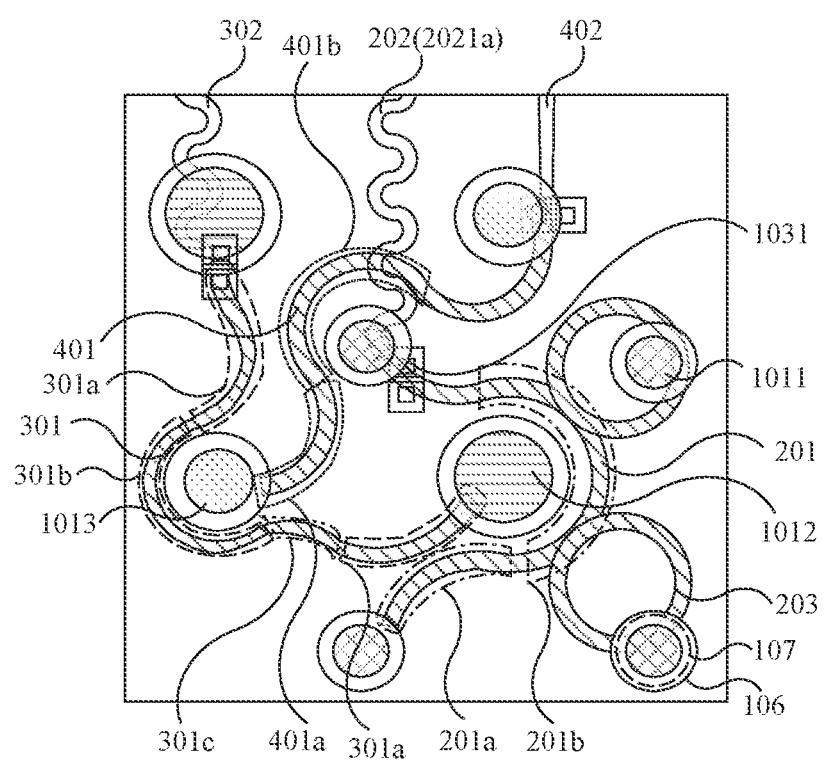
Figure 2D:
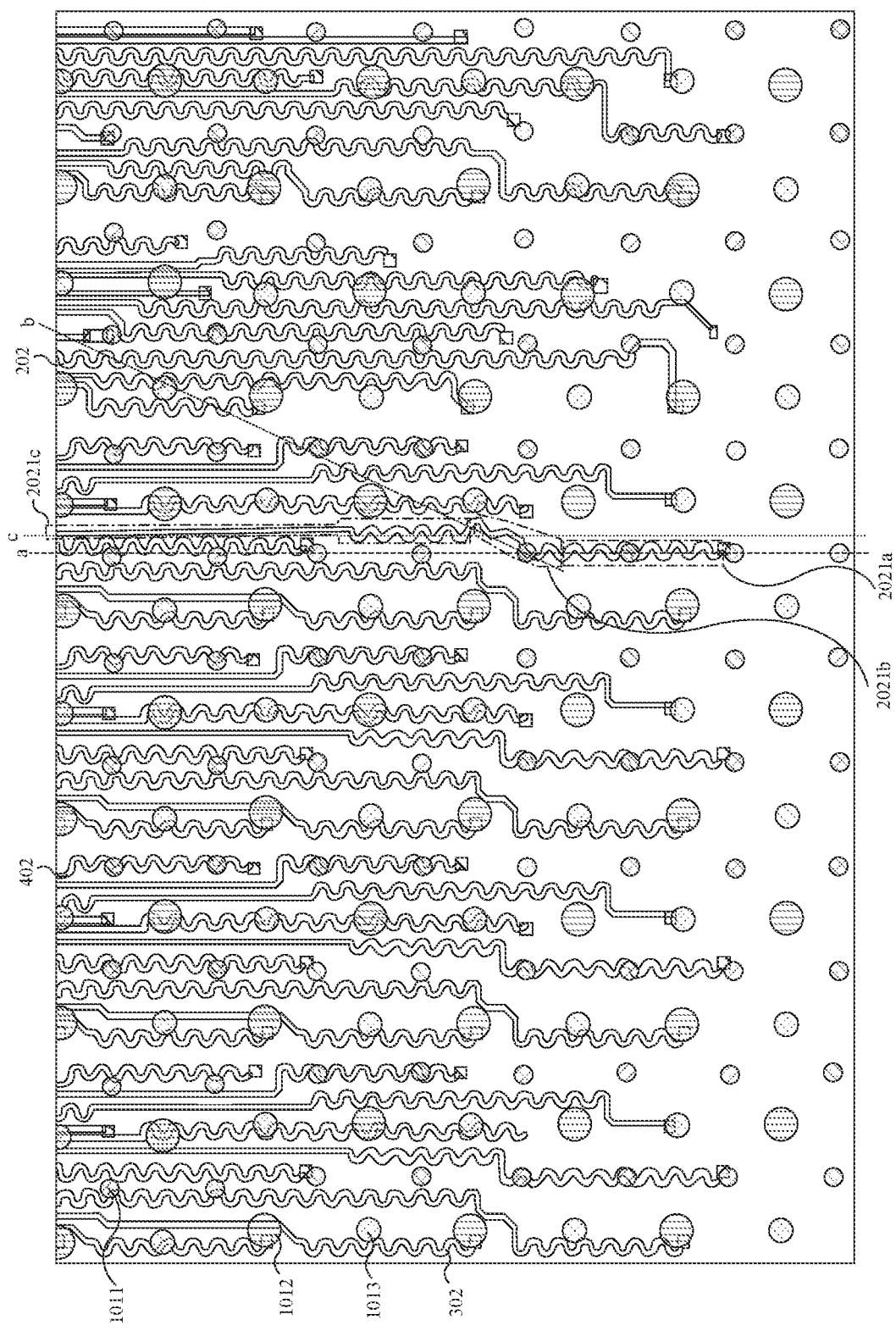
Figure 2E:
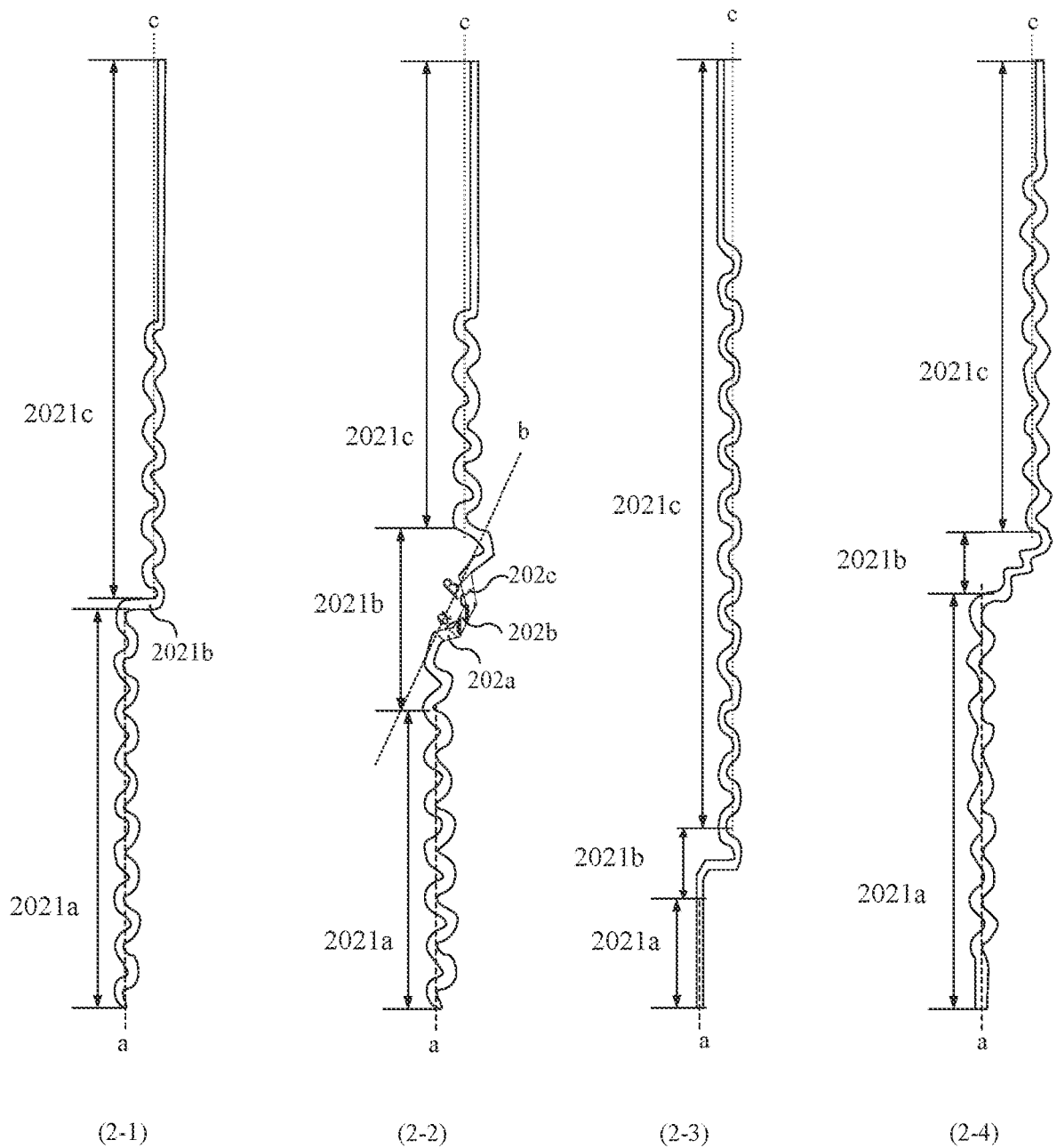
Figure 2F:
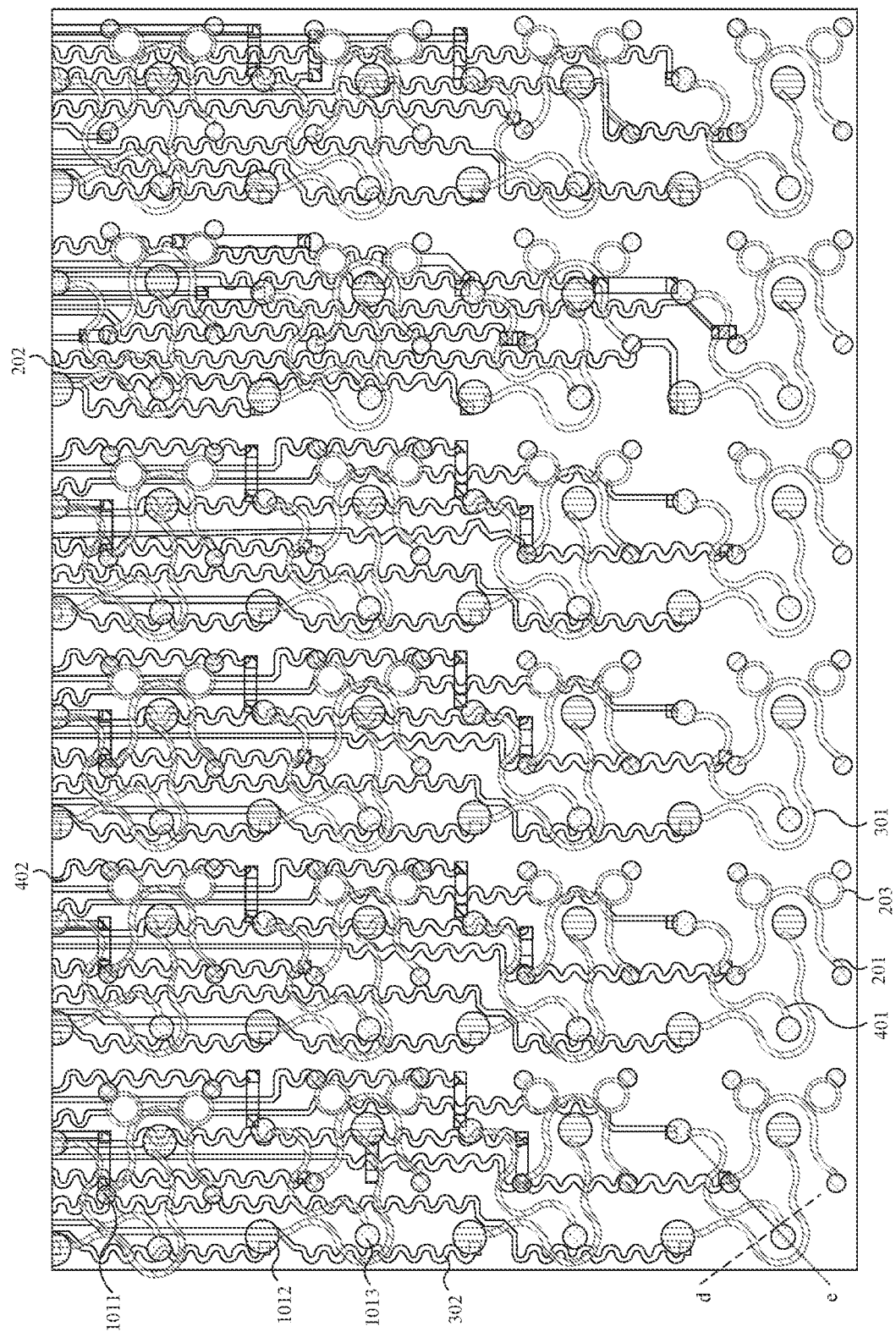

Specifically, please refer to FIG. 1A, which is a schematic structural diagram of a display panel provided by an embodiment of the application. As shown in FIG. 1B, which is a partially enlarged view of A in FIG. 1A. As shown in FIG. 1C, which is a schematic structural view of the display panel in FIG. 1A taken along a B-B' section. As shown in FIG. 1D, which is a partially enlarged view at C in FIG. 1B. As shown in FIG. 2A-FIG. 2F, which are schematic diagrams of structures of the connecting lines provided by embodiments of the application. Wherein, FIG. 2A-FIG. 2C show schematic structural diagrams of a first connecting line, a third connecting line, a fourth connecting line, and a fifth connecting line provided by the embodiments of the application. FIG. 2D-FIG. 2F show schematic structural diagrams of a second connecting line, a sixth connecting line, and a seventh connecting line provided by the embodiments of this application.

An embodiment of the present application provides a display panel 100 including a display light-transmitting area 100a, a main display area 100c, and a transition display area 100b between the main display area 100c and the display light-transmitting area 100a. The display panel 100 includes: a plurality of sub-pixels 101, and the plurality of sub-pixels 101 includes at least two first sub-pixels 1011 positioned in the display light-transmitting area 100a, a first pixel driving circuit 102 positioned in the transition display area 100b and is configured to drive at least two of the first sub-pixels 1011 to emit light, and a connecting line including a first line 200 electrically connected to the first pixel driving circuit 102 and the at least two first sub-pixels 1011, wherein at least part of the first line is snake-shaped. At least part of the connecting line is designed to be irregular, so as to reduce the problem of light interference and diffraction in the display light-transmitting area 100a and improve the display effect of the display light-transmitting area 100a, wherein, the snake-shaped part includes at least one of arc wiring or wave wiring.

Specifically, please refer to FIG. 1C and FIG. 2A-FIG. 2C. The first line 200 includes at least a first connecting line 201 positioned in the display light-transmitting area 100a and electrically connected to the at least two first sub-pixels 1011, and the first connecting line 201 is snake-shaped.

Compared with a linear design of the first connecting line 201, there is a slit between two adjacent first connecting lines 201, and the distances between each slit are smaller. As a result, light passing through the slit is likely to cause interference and diffraction phenomena. Setting the first connecting line 201 as a snake-shaped line can prevent the slit from being formed between two adjacent first connecting lines 201. Breaking the regular arrangement of the first connecting lines 201 helps to reduce light interference and diffraction and reduce the influence of light interference and diffraction on the display light-transmitting area 100a.

Please refer to FIG. 1C and FIG. 2D. The first line 200 further includes: a second connecting line 202 electrically connected to the first pixel driving circuit 102, the second connecting line 202 extends in a direction from the transition display area 100b toward the display light-transmitting area 100a and is connected to the first connecting line 201, wherein at least part of the second connecting line 202 positioned in the display light-transmitting area 100a is snake-shaped, so as to realize electrical connection between the first sub-pixel 1011 and the first pixel driving circuit 102.

Further, shapes of the first connecting line 201 and the second connecting line 202 are different (For example, the first connecting line 201 and the second connecting line 202 are snake-shaped lines with different curvatures. Alternatively, at least part of the second connecting line 202 is wave-shaped, a straight line, or a polyline, and at least part of the first connecting line 201 is arc-shaped, etc.), and/or an extension direction of the first connecting line 201 is different from an extension direction of the second connecting line 202, and/or an extension width and extension length of the first connecting line 201 is different from an extension width and extension length of the second connecting line 202. The irregular design between the first connecting line 201 and the second connecting line 202 is attained, which reduces a risk of light interference or diffraction problems.

Further, the second connecting line 202 and the first connecting line 201 are positioned in different layers to reduce wiring density, to avoid the occurrence of slits, etc., due to the small distance between the plurality of first connecting lines 201, which may cause light interference and diffraction problems in the display light-transmitting area 100a. It is beneficial to increase the light transmission area of the display light-transmitting area 100a and increase the light transmittance of the display light-transmitting area 100a.

Further, please refer to FIG. 2D. At least two of the second connecting lines 202 have different shapes. For example, part of the at least two second connecting lines 202 is mirrored or symmetrical; extension lengths and widths of the at least two second connecting lines 202 are different; and at least part of at least one second connecting line 202 adopts a straight line design, a polyline line design, etc.

Please refer to FIG. 2A-FIG. 2F, at least one of the second connecting lines 202 includes a first extension portion 2021a and a second extension portion 2021b. One end of the first extension portion 2021a is connected to the first connecting line 201, the other end of the first extension portion 2021a is connected to the second extension portion 2021b, an extension direction of the second extension portion 2021b is different from an extension direction of the first extension portion 2021a so that the second connecting line 202 is connected to a corresponding first connecting line 201 in the display light-transmitting area 100a.

Further, the second connecting line 202 further includes a third extension portion 2021c disposed along a different extension line from the first extension portion 2021a. The second extension portion 2021b connects the first extension portion 2021a and the third extension portion 2021c, so that the second extension 2021b functions to change the extension direction, thereby connecting the first extension portion 2021a and the third extension portion 2021c disposed along different extension lines.

Wherein, the second extension portion 2021b can be a straight line, as shown in (2-1) in FIG. 2E, or at least part of it is a polyline. As shown in (2-2) and (2-3) in FIG. 2E, or at least part of it is a snake-shaped wiring. As shown in (2-4) in FIG. 2E, when at least part of the second extension portion 2021b is a polyline, an angle between segments of the polyline is an obtuse angle.

Specifically, as shown in (2-2) in FIG. 2D and FIG. 2E, the first extension portion 2021a is disposed along the first extension line a, and the third extension 2021c is disposed along the third extension line c. The second extension portion 2021b is disposed along the second extension line b and connects the first extension portion 2021a and the third extension portion 2021c. The second extension portion 2021b includes at least a first straight line 202a, a second straight line 202b, and a third straight line 202c with different extension directions. One end of the second straight line 202b is connected to the first straight line 202a, and the other end of the second straight line 202b is connected to the third straight line 202c. The second straight line 202b and the first straight line 202a form a first angle α, and the second straight line 202b, and the third straight line 202c form a second angle β. The first angle α and the second angle β are obtuse angles.

Further, the portion of the second extension portion 2021b connected to the end of the first straight line 202a away from the second straight line 202b can be a snaked-shape wiring, and a polyline design can also be used. The portion of the second extension portion 2021b connected to the end of the third straight line 202c away from the second straight line 202b can be a snaked-shape wiring, and a polyline design can also be used.

Further, an extension direction of the third extension portion 2021c is same as an extension direction of the first extension portion 2021a.

Further, one end of the third extension portion 2021c is connected to the second extension portion 2021b, and the other end is electrically connected to the first pixel driving circuit 102. At least part of the third extension portion 2021c is snake-shaped.

Because the first pixel driving circuit 102 is positioned in the display transition area 100b, the wiring of the display transition area 100b is denser than that of the display light-transmitting area 100a. Therefore, in order to ensure the rationality of wiring without increasing the thickness of the display panel. The portion of the second connecting line 202 that is snake-shaped can be arranged in an area where wiring is relatively sparse. That is, the portion of the second connecting line 202 close to the display light-transmitting area 100a and the portion corresponding to the display light-transmitting area 100a are snake-shaped. Therefore, the influence of light interference and diffraction on the display light-transmitting area 100a is reduced. If the wiring in the display light-transmitting area is dense, the portion of the second connecting line 202 connected to the first connecting line 201 can also adopt a linear design.

Please refer to FIG. 1C, and FIG. 2B-FIG. 2C, the first line 200 also includes the third connecting line 203 positioned in the display light-transmitting area 100a. The third connecting line 203 electrically connects the first connecting line 201 and at least one of the first sub-pixels 1011. A shape of the third connecting line 203 is different from a shape of the first connecting line 201.

Further, the third connecting line 203 can be a non-closed shape (such as a snake-shaped line, a straight line, or a polyline, etc.). As shown in FIG. 2B, the third connecting line 203 can also be an integrated closed shape (such as a circle, an oval, etc.). As shown in FIG. 2C, while reducing the routing distance of the first connecting line 201, a plurality of the first sub-pixels 1011 are also electrically connected, so that the first pixel driving circuit 102 can simultaneously drive the plurality of the first sub-pixels 1011 to emit light.

Specifically, the display panel 100 includes a plurality of first pixel units positioned in the display light-transmitting area 100a. Each of the first pixel units includes a plurality of first pixels, and each of the first pixels includes a plurality of the first sub-pixels 1011. At least two of the first sub-pixels 1011 are electrically connected through the first connecting line 201, and at least two of the first sub-pixels 1011 are electrically connected through the third connecting line 203 and the first connecting line 201. In this way, the electrical connection between the plurality of first sub-pixels 1011 is realized, so that the first pixel driving circuit 102 can simultaneously drive the plurality of first sub-pixels 1011 to emit light.

Please continue to refer to FIG. 2-FIG. 2C, the plurality of sub-pixels 101 further includes a second sub-pixel 1012 positioned in the display light-transmitting area 100a. The first connecting line 201 includes a first connecting portion 201a and a second connecting portion 201b connected to the first connecting portion 201a. The first connecting portion 201a is electrically connected to the first sub-pixel 1011, and the second connecting portion 201b bypasses the second sub-pixel 1012 to prevent the first connecting line 201 electrically connecting the two first sub-pixels 1011 from being electrically connected to the second sub-pixel 1012.

Wherein, a curvature of the first connecting portion 201a is different from a curvature of the second connecting portion 201b, so that the second connecting portion 201b can bypass the second sub-pixel according to the design of the second sub-pixel 1012. This prevents electrical connection between the second connecting portion 201b and the second sub-pixel 1012. Further, the curvature of the first connecting portion 201a is less than the curvature of the second connecting portion 201b.

Further, the light-emitting color of the first sub-pixel 1011 and that of the second sub-pixel 1012 are different. The light-emitting color of the first sub-pixel 1011 and that of the second sub-pixel 1012 include red, green, blue, white, etc.

It can be understood that the display panel 100 further includes a third sub-pixel 1013 with a light light-emitting color different from those of the first sub-pixel 1011 and the second sub-pixel 1012. The third sub-pixel 1013 is positioned in the display light-transmitting area 100a. The connecting line further includes a second line, and the second line is electrically connected to a second pixel driving circuit and at least two of the second sub-pixels 1012. At least part of the second line is a snake-shaped.

Further, the second line includes at least a fourth connecting line 301, positioned in the display light-transmitting area 100a and electrically connected to at least two of the second sub-pixels 1012. The fourth connecting line 301 is a snake-shaped wiring.

Wherein, the fourth connecting line 301 includes a third connecting portion 301a and a fourth connecting portion 301b connected to the third connecting portion 301a. The third connecting portion 301a is electrically connected to the second sub-pixel 1012, and the fourth connecting portion 301b bypasses the third sub-pixel 1013. This prevents the fourth connecting line 301 electrically connecting the two second sub-pixels 1012 from being electrically connected to the third sub-pixel 1013.

Further, a curvature of the third connecting portion 301a is different from a curvature of the fourth connecting portion 301b. Furthermore, the curvature of the third connecting portion 301a is less than the curvature of the fourth connecting portion 301b.

Furthermore, the second line further includes a sixth connecting line 302. The sixth connecting line 302 and the fourth connecting line 301 are positioned in different layers and are electrically connected to the second pixel driving circuit. The sixth connecting line 302 extends along a direction from the transition display area 100b toward the display light-transmitting area 100a and is connected to the fourth connecting line 301, wherein, at least part of the sixth connecting line 302 positioned in the display light-transmitting area 100a is a snake-shaped wiring.

Similarly, the connecting line also includes: a third line electrically connected to the third pixel driving circuit and at least two of the third sub-pixels 1013. At least part of the third line is a snake-shaped wiring.

Wherein, the fifth connecting line 401 includes a fifth connecting portion 401a and a sixth connecting portion 401b connected to the fifth connecting portion 401a. The fifth connecting portion 401a is electrically connected to the third sub-pixel 1013, and the sixth connecting portion 401b bypasses the first sub-pixel 1011. This can prevent the fifth connecting line 401 electrically connecting the two third sub-pixels 1013 from being electrically connected to the first sub-pixel 1011.

Further, a curvature of the fifth connecting portion 401a is different from a curvature of the sixth connecting portion 401b. Furthermore, the curvature of the fifth connecting portion 401a is less than the curvature of the sixth connecting portion 401b.

Furthermore, the third line further includes a seventh connecting line 402. The seventh connecting line 402 and the fifth connecting line 401 are positioned on different layers and electrically connected to the third pixel driving circuit. The seventh connecting line 402 extends in a direction from the transition display area 100b toward the display light-transmitting area 100a and is connected to the fifth connecting line 401, wherein, at least part of the seventh connecting line 402 positioned in the display light-transmitting area 100a is a snake-shaped wiring.

It can be understood that at least one of the sixth connecting lines 302, and/or at least one of the seventh connecting line 402 and the second connecting line 202 have the same design. That is, it includes extension portions with similar designs to the first extension portion 2021a, the second extension portion 2021b, and the third extension portion 2021c, which will not be repeated herein.

Please continue to refer to FIG. 2A-FIG. 2F. The description will be made by taking an example that the first pixel includes four first sub-pixels 1011, two second sub-pixels 1012, and two third sub-pixels 1013 as one pixel repeating unit. The four first sub-pixels 1011 are arranged in an array to form a first quadrilateral. The two second sub-pixels 1012 and the two third sub-pixels 1013 are arranged in an array to form a second quadrilateral. The two second sub-pixels 1012 are positioned on a first diagonal of the second quadrilateral, and the two third sub-pixels 1013 are positioned on a second diagonal of the second quadrilateral. Wherein, one of the two second sub-pixels 1012 is positioned on the middle of the first quadrilateral, and one of the four first sub-pixels 1011 is positioned on the middle of the second quadrilateral. The four first sub-pixels 1011 are electrically connected to the same first pixel driving circuit 102 through the first connecting line 201, the second connecting line 202, and the third connecting line 203. The two second sub-pixels 1012 are electrically connected to the same second pixel driving circuit through the fourth connecting line 301 and the sixth connecting line 302. The two third sub-pixels 1013 are electrically connected to the same third pixel driving circuit through the fifth connecting line 401 and the seventh connecting line 402. The extension directions of the first connecting line 201, the fourth connecting line 301, and the fifth connecting line 401 are different.

Wherein, the second pixel driving circuit is configured to drive the second sub-pixel 1012 to emit light, and the third pixel driving circuit is configured to drive the third sub-pixel 1013 to emit light. The second pixel driving circuit, the third pixel driving circuit, and the first pixel driving circuit 102 are all positioned in the transition display area 100*b*.

Please continue to refer to FIG. 2C and FIG. 2F. In a top view, two of the four first sub-pixels 1011 positioned in the same row and being close to the two second sub-pixels 1012 and the two third sub-pixels 1013 are connected by the first connecting line 201. Specifically, the ends of the two first connecting portions 201*a* are connected to the two first sub-pixels 1011. The second connecting portion 201*b* bypasses a first side of the second sub-pixel 1012 positioned in the middle of the first quadrilateral and is connected between the two first connecting portions 201*a*. A center of a curvature circle of the first connecting portion 201*a* and a center of a curvature circle of the second connecting portion 201*b* are respectively positioned on opposite sides of the first connecting line 201. Wherein, the first side of the second sub-pixel 1012 is a side of the second sub-pixel 1012 away from the third sub-pixel 1013 in the same column as the second sub-pixel 1012. The other two first sub-pixels 1011 among the four first sub-pixels 1011 are connected to the second connecting portion 201*b* through two third connecting lines 203. The second connecting line 202 is connected between one of the two first connecting portions 201*a* and the first pixel driving circuit 102.

The two second sub-pixels 1012 are connected by the fourth connecting line 301. Specifically, the ends of the two third connecting portions 301*a* are connected to the two second sub-pixels 1012. The fourth connecting portion 301*b* bypasses a second side of the third sub-pixel 1013 in the same column as the second sub-pixel 1012 positioned in the middle of the first quadrilateral and is connected between the two third connecting portions 301*a*. A center of a curvature circle of the third connecting portion 301*a* and a center of a curvature circle of the fourth connecting portion 301*b* are respectively positioned on opposite sides of the fourth connecting line 301. Wherein, the second side of the third sub-pixel 1013 is a side of the third sub-pixel 1013 away from the first sub-pixel 1011 positioned in the middle of the second quadrilateral. The sixth connecting line 302 is connected between one of the two third connecting portions 301*a* and the second pixel driving circuit.

The two third sub-pixels 1013 are connected by the fifth connecting line 401. Specifically, the ends of the two fifth connecting portions 401*a* are connected to the two third sub-pixels 1013. The sixth connecting portion 401*b* bypasses the third side of the first sub-pixel 1011 positioned in the middle of the second quadrilateral and is connected between the two fifth connecting portions 401*a*. A center of a curvature circle of the fifth connecting portion 401*a* and a center of a curvature circle of the sixth connecting portion 401*b* are respectively positioned on opposite sides of the fifth connecting line 401. Wherein, the third side of the first sub-pixel 1011 is a side of the first sub-pixel 1011 away from the second sub-pixel 1012 positioned in the middle of the first quadrilateral. The seventh connecting line 402 is connected between one of the two fifth connecting portions 401*a* and the third pixel driving circuit.

Further, the connecting line d connecting the two ends of the fourth connecting portion 301*b* is approximately perpendicular to the connecting line e connecting the two third sub-pixels 1013. A central angle of the second connecting portion 201*b* is greater than a central angle of the fourth connecting portion 301*b*. Furthermore, the light-emitting color of the first sub-pixel 1011 is green, the light-emitting color of the second sub-pixel 1012 is blue, and the light-emitting color of the third sub-pixel 1013 is red.

In order to reduce the difficulty of the manufacturing process, the first connecting line 201, the third connecting line 203, the fourth connecting line 301, and the fifth connecting line 401 can be arranged in the same layer. The second connecting line 202, the sixth connecting line 302, and the seventh connecting line 402 can be arranged in the same layer.

Further, when the first connecting line 201, the fourth connecting line 301, and the fifth connecting line 401 are arranged in the same layer, in order to avoid a short circuit between the connecting lines connecting different sub-pixels 101, a minimum distance between any two of the first connecting line 201, the fourth connecting line 301, and the fifth connecting line 401 is greater than 2 microns. That is, the minimum distance between the first connecting line 201 and the fourth connecting line 301, and/or the minimum distance between the first connecting line 201 and the fifth connecting line 401, and/or the minimum distance between the fourth connecting line 301 and the fifth connecting line 401 are all greater than 2 microns. Wherein, the minimum distance may be determined according to the actual manufacturing process, and the minimum distance may also be greater than 2.5 micrometers, 3 micrometers, etc., which will not be repeated herein.

Further, at least one of the first connecting line 201, the fourth connecting line 301, and the fifth connecting line 401 may further include a seventh connecting portion 301*c*. Specifically, please refer to FIG. 2B-FIG. 2C, the fourth connecting line 301 includes the seventh connecting portion 301*c*. The seventh connecting portion 301*c* connects the third connecting portion 301*a* and the fourth connecting portion 301*b*, so as to avoid the short-circuit problem caused by the short distance between the third connecting portion 301*a* and the first connecting portion 201*a*.

Please continue to refer to FIG. 2B-FIG. 2C. The minimum distance between any two adjacent connecting portions of the first connecting portion 201*a* to the seventh connecting portion 301*c* can be set to avoid short circuits between the connecting lines connecting different sub-pixels 101. That is, the minimum distance between any two adjacent connecting portions of the first connecting portion 201*a*, the second connecting portion 201*b*, the third connecting portion 301*a*, the fourth connecting portion 301*b*, the fifth connecting portion 401*a*, the sixth connecting portion 401*b*, and the seventh connecting portion 301*c* is greater than 2 microns. Specifically, the minimum distance between the first connecting portion 201*a* of the first connecting line 201 and the third connecting portion 301*a* of the fourth connecting line 301, and the minimum distance between the first connecting portion 201*a* of the first connecting line 201 and the fifth connecting portion 401*a* of the fifth connecting line 401 is respectively greater than 2 microns. The minimum distance between the second connecting portion 201*b* of the first connecting line 201 and the fifth connecting portion 401*a* of the fifth connecting line 401 is greater than 2 microns. The minimum distance between the third connecting portion 301*a* of the fourth connecting line 301 and the sixth connecting portion 401*b* of the fifth connecting line 401 and between the minimum distance between the third connecting portion 301*a* of the fourth connecting line 301 and the fifth connecting portion 401*a* of the fifth connecting line 401 is respectively greater than 2 microns. The minimum distance between the fifth connecting portion 401*a* of the fifth connecting line 401 and the seventh connecting portion 301c of the fourth connecting line 301 is greater than 2 microns.

Further, when the second connecting line 202, the sixth connecting line 302, and the seventh connecting line 402 are arranged in the same layer, in order to break the regular arrangement between any two of the second connecting line 202, the sixth connecting line 302, and the seventh connecting line 402, the bending directions of any two adjacent connecting lines among the second connecting line 202, the sixth connecting line 302, and the seventh connecting line 402 can be disposed oppositely, or their bending curvatures can be disposed of inconsistently, to avoid light interference and diffraction problems.

In addition, in order to avoid the electrical connection between the first connecting line 201 and the second sub-pixel 1012, the minimum distance between the second connecting portion 201b of the first connecting line 201 and the second sub-pixel 1012 is greater than 2 microns. Similarly, the minimum distance between the fourth connecting portion 301b of the fourth connecting line 301 and the third sub-pixel 1013 is greater than 2 microns to avoid the electrical connection between the fourth connecting line 301 and the third sub-pixel 1013. Similarly, the minimum distance between the sixth connecting portion 401b of the fifth connecting line 401 and the first sub-pixel 1011 is greater than 2 microns to avoid the electrical connection between the fifth connecting line 401 and the first sub-pixel 1011.

It can be understood that the display panel 100 may further include a plurality of sub-pixels such as a fourth sub-pixel, a fifth sub-pixel, etc., in the display light-transmitting area 100a. The light-emitting colors of the first sub-pixel 1011, the second sub-pixel 1012, the third sub-pixel 1013, the fourth sub-pixel, and the fifth sub-pixel include red, green, blue, white, etc. The arrangement of the plurality of sub-pixels is not limited to those shown in FIG. 2A-FIG. 2F.

Please continue to refer to FIG. 1C and FIG. 2A-FIG. 2C, the display panel 100 further includes a first insulating layer 103 positioned between the first connecting line 201 and the second connecting line 202. The first connecting line 201 and the second connecting line 202 are electrically connected through a via-hole 1031 in the first insulating layer 103.

Further, the second connecting line 202 can be directly or indirectly electrically connected to the first pixel driving circuit 102. When the second connecting line 202 is indirectly electrically connected to the first pixel driving circuit 102, the display panel 100 further includes a first wiring 104 disposed in the transition display area 100b, positioned on a side of the second connecting line 202 away from the first connecting line 201, and is electrically connected to the first pixel driving circuit 102.

The second insulating layer 105 is positioned between the first wiring 104 and the second connecting line 202. The first wiring 104 and the second connecting line 202 are electrically connected through the via-hole in the second insulating layer 105, to realize the electrical connection between the second connecting line 202 and the first pixel driving circuit 102 through the first wiring 104. Therefore, at least two of the first sub-pixels 1011 are electrically connected to the first pixel driving circuit 102 through the first connecting line 201, the second connecting line 202, and the first wiring 104.

That is, the driving current of the first pixel driving circuit 102 for driving at least two of the first sub-pixels 1011 is transmitted to the second connecting line 202 via the first wiring 104, and then it is transmitted to the first connecting line 201 via the second connecting line 202. Finally, the first connecting line 201 is transmitted to the first sub-pixel 1011 to drive at least two of the first sub-pixels 1011 to emit light.

In addition, the electrical connection between the second connecting line 202 and the first pixel driving circuit 102 is realized through the first wiring 104, which can also increase the wiring space of the second connecting line 202, reduce the probability of slits forming between any two second connecting lines 202 and help to reduce light interference and diffraction.

In order to increase the light transmission area of the display light-transmitting area 100a and increase the light transmittance of the display light-transmitting area 100a, the materials of the first wiring 104 include indium tin oxide, zinc indium oxide, zinc gallium oxide, zinc gallium indium oxide, silver nanowires, etc.

Further, at least part of the first wiring 104 is snake-shaped to reduce the problems of light interference and diffraction in the transition display area 100b, so that the display quality of the transition display area 100b is improved.

It can be understood that the display panel 100 further includes a second wiring electrically connected to the second pixel driving circuit and the sixth connecting line 302, and a third wiring electrically connected to the third pixel driving circuit and the seventh connecting line 402. The first wiring 104, the second wiring, and the third wiring can be arranged in the same layer to simplify the manufacturing process. Wherein, for the connection manner of the second pixel driving circuit with the sixth connecting line 302 and the second wiring and the connection manner of the third pixel driving circuit with the seventh connecting line 402 and the third wiring, please refer to the connection manner of the first pixel driving circuit 102 with the second connecting line 202 and the first wiring 104 in FIG. 1C, which will not be repeated herein.

Further, when the second connecting line 202, the sixth connecting line 302, and the seventh connecting line 402 are arranged in the same layer, the sixth connecting line 302 can be connected to the fourth connecting line 301 through the second wiring, and the seventh connecting line 402 can be connected to the fifth connecting line 401 through the third wiring, to avoid the problem of a short circuit between the second connecting line 202, the sixth connecting line 302, and the seventh connecting line 402, as shown in FIG. 2F.

Please continue to refer to FIG. 1A-FIG. 1D. The display panel 100 further includes a plurality of main sub-pixels and a main pixel driving circuit positioned in the main display area 100c. The main pixel driving circuit is configured to drive the main sub-pixels to emit light, and an opening area of each main sub-pixel is larger than an opening area of the corresponding sub-pixel 101. Specifically, the plurality of main sub-pixels includes: a first main sub-pixel with the same light-emitting color as the first sub-pixel 1011, a second main sub-pixel with the same light-emitting color as the second sub-pixel 1012, and a third main sub-pixel with the same light-emitting color as the third sub-pixel 1013. An opening area of the first main sub-pixel is larger than an opening area of the first sub-pixel 1011, an opening area of the second main sub-pixel is larger than an opening area of the second sub-pixel 1012, and an opening area of the third main sub-pixel is larger than an opening area of the third sub-pixel 1013.

Further, the display panel 100 further includes a plurality of transition sub-pixels and a transition pixel driving circuit positioned in the transition display area 100b. The transition pixel driving circuit is configured to drive the transition sub-pixel to emit light. The plurality of transition sub-pixels includes a first transition sub-pixel with the same light-emitting color as the first sub-pixel 1011, a second transition sub-pixel with the same light-emitting color as the second sub-pixel 1012, and a third transition sub-pixel with the same light-emitting color as the third sub-pixel 1013. Wherein, an opening area of each transition sub-pixel is larger than or equal to an opening area of the corresponding sub-pixel 101, to enable the display panel 100 to achieve uniform display in the main display area 100c, the transition display area 100b, and the display light-transmitting area. Specifically, the opening area of the first transition sub-pixel is larger than or equal to the opening area of the first sub-pixel 1011, the opening area of the second transition sub-pixel is larger than or equal to the opening area of the second sub-pixel 1012, and the opening area of the third transition sub-pixel is larger than or equal to the opening area of the third sub-pixel 1013, to realize the display transition from the main display area 100c to the display light-transmitting area 100a and to realize uniform display of the display panel 100 in the main display area 100c, the transition display area 100b, and the display light-transmitting area.

In order to further improve the display uniformity of the main display area 100c, the display light-transmitting area 100a, and the transition display area 100b, the display panel 100 further includes a plurality of second pixel units positioned in the transition display area 100b and a plurality of third pixel units positioned in the main display area 100c. Each of the second pixel units includes a plurality of second pixels, and each of the third pixel units includes a plurality of third pixels. Each of the second pixels includes a plurality of the transition sub-pixels, and each of the third pixels includes a plurality of the main sub-pixels. The distribution density of the first pixels in the display light-transmitting area 100a is the same as the distribution density of the third pixels in the main display area 100c. The number and arrangement of the first pixels included in the first pixel unit are the same as the number and arrangement of the third pixels included in the third pixel unit. Further, the distribution density of the first pixels in the display light-transmitting area 100a is the same as the distribution density of the second pixels in the transition display area 100b. The number and arrangement of the first pixels included in the first pixel unit are the same as the number and arrangement of the second pixels included in the second pixel unit.

Furthermore, the number and arrangement of the first sub-pixels 1011 in the first pixel are the same as the number and arrangement of the first main sub-pixels in the third pixel. Similarly, the number and arrangement of the second sub-pixels 1012 in the first pixel are the same as the number and arrangement of the second main sub-pixels in the third pixel. Similarly, the number and arrangement of the third sub-pixels 1013 in the first pixel are the same as the number and arrangement of the third main sub-pixels in the third pixel. Further, the number and arrangement of the first sub-pixels 1011 in the first pixel are the same as the number and arrangement of the first transition sub-pixels in the second pixel. Similarly, the number and arrangement of the second sub-pixels 1012 in the first pixel are the same as the number and arrangement of the second transition sub-pixels in the second pixel. Similarly, the number and arrangement of the third sub-pixels 1013 in the first pixel are the same as the number and arrangement of the third transition sub-pixels in the second pixel.

Further, the first pixel driving circuit 102, the second pixel driving circuit, the third pixel driving circuit, the transition pixel driving circuit, and the main pixel driving circuit all include a plurality of transistors. The plurality of transistors include a field-effect transistor. Specifically, the plurality of transistors include a thin film transistor. Furthermore, the plurality of transistors include at least one of a silicon transistor or an oxide transistor. The plurality of transistors include at least one of an N-type transistor or a P-type transistor.

Please continue to refer to FIG. 1C and FIG. 2A-FIG. 2C. The display panel 100 further includes: a first electrode layer 106 positioned in the same layer as the first connecting line 201, wherein the first connecting line 201 connects the two first electrode layers 106; and a first electrode portion 107 positioned on the first electrode layer 106 and electrically connected to the first electrode layer 106, wherein the first electrode portion 107 and the first electrode layer 106 form an anode of the first sub-pixel 1011. Further, from a top view, the first electrode portion 107 is positioned in the first electrode layer 106.

Further, the display panel 100 further includes a substrate 108. An orthographic projection of the first electrode portion 107 on the substrate 108 partially overlaps with an orthographic projection of the first electrode layer 106 on the substrate 108, and an orthographic projection area of the first electrode portion 107 on the substrate 108 is smaller than an orthographic projection area of the first electrode layer 106 on the substrate 108.

In order to avoid electrical connection between the sixth connecting portion 401b of the fifth connecting line 401 that bypasses the first sub-pixel 1011 and the first sub-pixel 1011 when the first electrode layer 106 and the fifth connecting line 401 are positioned in the same layer, the minimum distance between the sixth connecting portion 401b of the fifth connecting line 401 and the first electrode layer 106 is greater than 2 microns. Similarly, for the design of the second connecting portion 201b of the first connecting line 201 and the second sub-pixel 1012, and the design of the fourth connecting portion of the fourth connecting line and the third sub-pixel, please refer to the arrangement of the sixth connecting portion 401b of the fifth connecting line 401 and the first electrode layer 106.

Further, the first electrode portion 107 includes a first transparent layer 1071 and a first reflective layer 1072. The first reflective layer 1072 is positioned between the first transparent layer 1071 and the first electrode layer 106, and the first transparent layer 1071 and the first electrode layer 106 are made of a transparent conductive film. Specifically, the transparent conductive film includes indium tin oxide, zinc indium oxide, zinc gallium oxide, zinc gallium indium oxide, etc. The material for manufacturing the first reflective layer 1072 includes one or more of aluminum (Al), silver (Ag), calcium (Ca), gold (Au), or copper (Cu).

Further, in order to reduce the influence of the connecting line on the light transmittance of the display light-transmitting area 100a, the materials of the connecting line include indium tin oxide, zinc indium oxide, zinc gallium oxide, zinc gallium indium oxide, silver nanowires, or the like.

The first line 200 in the embodiment of the present application includes the first connecting line 201, the second connecting line 202, and the third connecting line 203, but it is not limited thereto. In other embodiments, the first line 200 may further include a multilayer connecting line or be connected to a multilayer wiring, so as to be electrically connected to the first pixel driving circuit 102 and the first sub-pixel 1011, and increase the wiring space of the connecting line.

Please continue to refer to FIG. 1C. The display panel 100 further includes a pixel definition layer 109 on the anode. The light-emitting layer 110 of the first sub-pixel 1011 is positioned in the pixel definition area of the pixel definition layer 109, and the cathode 111 of the first sub-pixel 1011 is positioned on the pixel defining layer 109 and the light-emitting layer 110.

Further, the display panel 100 further includes a buffer layer, an encapsulation layer, a color filter layer, and other parts not shown. The light-emitting layer may further include at least one of a fluorescent material, a quantum dot material, or a perovskite material.

The display panel 100 further includes a plurality of light-emitting devices, at least part of the light-emitting devices is configured to form the first sub-pixel 1011. The light-emitting device includes at least one of organic light-emitting diodes, sub-millimeter light-emitting diodes, or micro light-emitting diodes.

An embodiment of the present application also provides a display device, including the above-mentioned display panel and sensor. The sensor corresponds to the display light-transmitting area so that the display device realizes functions such as fingerprint recognition, imaging, light sensing, and distance sensing.

Specifically, the sensors include fingerprint recognition sensors, cameras, structured light sensors, time-of-flight sensors, distance sensors, light sensors, etc. In this way, the sensor can collect signals through the display light-transmitting area, so that the display device can realize under-screen fingerprint recognition, under-screen camera, under-screen recognition, under-screen distance sensing, and other under-screen sensing solutions.

Because at least part of the first line in the display panel is snake-shaped, the problem of light interference and diffraction prone to occur in the display light-transmitting area of the display panel can be reduced. Therefore, the display effect of the display light-transmitting area is improved. In addition, the influence of light interference and diffraction on the display light-transmitting area can be reduced, and the interference of light interference and diffraction on the first light signal can be avoided, thereby improving the imaging effect of the display panel or improving the recognition accuracy of the display panel. Wherein, the first light signal includes an external light signal projected into the display panel (including ambient light, light emitted by a laser pointer, etc.), and a light signal emitted from inside of the display panel blocked by an external object and reflected back into the display panel.

Further, the display device further includes a touch panel, and the touch panel is combined with the display panel in a built-in type or external type so that the display device has a touch function. The display device includes fixed terminals such as televisions, desktop computers, mobile terminals such as mobile phones, notebook computers, wearable devices such as bracelets, virtual reality (VR) equipment, and augmented reality (AR) equipment.

In the above-mentioned embodiments, the description of each embodiment has its own focus. For parts that are not described in detail in an embodiment, reference may be made to related descriptions of other embodiments. The description of the above embodiment is only used to help understand the technical solution of the application and its core idea. Those of ordinary skill in the art should understand that they can still modify the technical solutions recited in the foregoing embodiments, or equivalently replace some of the technical features. These modifications or replacements do not cause the essence of the corresponding technical solutions to deviate from the scope of the technical solutions of the embodiments of the present invention.

What is claimed is:

1. A display panel, comprising a display light-transmitting area, a main display area, and a transition display area between the main display area and the display light-transmitting area, wherein the display panel further comprises:
   a plurality of sub-pixels comprising at least two first sub-pixels positioned in the display light-transmitting area;
   a first pixel driving circuit positioned in the transition display area and configured to drive the at least two first sub-pixels to emit light; and
   a connecting line comprising a first line electrically connected to the first pixel driving circuit and the at least two first sub-pixels, wherein at least part of the first line is snake-shaped.

2. The display panel according to claim 1, wherein the first line at least comprises a first connecting line positioned in the display light-transmitting area and electrically connected to the at least two first sub-pixels, and the first connecting line is snake-shaped.

3. The display panel according to claim 2, wherein the first line further comprises a second connecting line electrically connected to the first pixel driving circuit, the second connecting line extends in a direction from the transition display area toward the display light-transmitting area and is connected to the first connecting line, and at least part of the second connecting line positioned in the display light-transmitting area is snake-shaped.

4. The display panel according to claim 3, wherein a shape of the first connecting line is different from a shape of the second connecting line, and/or an extension direction of the first connecting line is different from an extension direction of the second connecting line, and/or an extension width of the first connecting line is different from an extension width of the second connecting line.

5. The display panel according to claim 3, wherein the second connecting line comprises a first extension portion, a second extension portion, and a third extension portion; one end of the first extension portion is connected to the first connecting line, the second extension portion is connected to the first extension portion and the third extension portion, an extension direction of the first extension portion is different from an extension direction of the second extension portion; and the first extension portion and the third extension portion are positioned on different extension lines.

6. The display panel according to claim 5, wherein at least part of the second extension portion is a polyline, and an angle between segments of the polyline is an obtuse angle.

7. The display panel according to claim 2, wherein the first line further comprises: a third connecting line positioned in the display light-transmitting area, and the third connecting line is electrically connected to the first connecting line and at least one of the first sub-pixels, and wherein a shape of the first connecting line is different from a shape of the third connecting line.

8. The display panel according to claim 2, wherein the plurality of sub-pixels further comprises second sub-pixels positioned in the display light-transmitting area, the first connecting line comprises a first connecting portion and a second connecting portion connected to the first connecting portion, the first connecting portion is electrically connected to one of the first sub-pixels, and the second connecting portion bypasses the second sub-pixels.

9. The display panel according to claim 8, further comprising a second pixel driving circuit positioned in the transition display area configured to drive at least two of the second sub-pixels to emit light, wherein the connecting line further comprises a second line electrically connected to the second pixel driving circuit and the at least two second sub-pixels, and at least part of the second line is snake-shaped.

10. The display panel according to claim 9, wherein the plurality of sub-pixels further comprise third sub-pixels positioned in the display light-transmitting area, the second line at least comprises a fourth connecting line positioned in the display light-transmitting area and electrically connected to the at least two second sub-pixels, the fourth connecting line is snake-shaped, the fourth connecting line comprises a third connecting portion and a fourth connecting portion connected to the third connecting portion, the third connecting portion is electrically connected to one of the second sub-pixels, and the fourth connecting portion bypasses the third sub-pixels.

11. The display panel according to claim 10, wherein the connecting line further comprises a third line electrically connected to a third pixel driving circuit and at least two of the third sub-pixels, and at least part of the third line is snake-shaped.

12. The display panel according to claim 11, wherein the third line at least comprises a fifth connecting line positioned in the display light-transmitting area and electrically connected to the at least two third sub-pixels, the fifth connecting line is snake-shaped, the fifth connecting line comprises a fifth connecting portion and a sixth connecting portion connected to the fifth connecting portion, the fifth connecting portion is electrically connected to one of the third sub-pixels, and the sixth connecting portion bypasses the first sub-pixels.

13. The display panel according to claim 12, wherein a curvature of the first connecting portion is different from a curvature of the second connecting portion, and/or a curvature of the third connecting portion is different from a curvature of the fourth connecting portion, and/or a curvature of the fifth connecting portion is different from a curvature of the sixth connecting portion.

14. The display panel according to claim 12, wherein a minimum distance between the first connecting line and the fourth connecting line, and/or a minimum distance between the first connecting line and the fifth connecting line, and/or a minimum distance between the fourth connecting line and the fifth connecting line is/are greater than 2 microns.

15. The display panel according to claim 12, wherein extension directions of the first connecting line, the fourth connecting line, and the fifth connecting line are different.

16. The display panel according to claim 8, wherein a center of a curvature circle of the first connecting portion and a center of a curvature circle of the second connecting portion are respectively positioned on opposite sides of the first connecting line.

17. The display panel according to claim 8, wherein a minimum distance between the second connecting portion and the second sub-pixels is greater than 2 microns.

18. The display panel according to claim 3, further comprising:
a first wiring arranged in the transition display area, positioned on a side of the second connecting line away from the first connecting line, and electrically connected to the first pixel driving circuit; and
a second insulating layer positioned between the first wiring and the second connecting line, wherein the first wiring and the second connecting line are electrically connected together through a via-hole in the second insulating layer.

19. The display panel according to claim 2, further comprising:
a first electrode layer disposed in a same layer as the first connecting line, wherein the first connecting line connects two of the first electrode layers; and
a first electrode portion positioned on the first electrode layers and electrically connected to the first electrode layers, wherein the first electrode portion and the first electrode layer form an anode of the at least two first sub-pixels.

20. A display device, comprising a display panel and a sensor, wherein the display panel comprises: a display light-transmitting area, a main display area, and a transition display area between the main display area and the display light-transmitting area, the sensor is disposed corresponding to the display light-transmitting area, and the display panel further comprises:
a plurality of sub-pixels comprising at least two first sub-pixels positioned in the display light-transmitting area;
a first pixel driving circuit positioned in the transition display area and configured to drive the at least two first sub-pixels to emit light; and
a connecting line comprising a first line electrically connected to the first pixel driving circuit and the at least two first sub-pixels, wherein at least part of the first line is snake-shaped.

* * * * *